(12) United States Patent
Lee et al.

(10) Patent No.: US 7,720,165 B2
(45) Date of Patent: May 18, 2010

(54) DEMAPPER APPLIED TO QUADRATURE AMPLITUDE MODULATION TRELLIS CODED MODULATION DECODER AND RELATED METHOD

(75) Inventors: Kai-Li Lee, Kao-Hsiung (TW); Jung-Tang Chiang, Hsin-Chu (TW)

(73) Assignee: Realtek Semiconductor Corp., HsinChu (TW)

(*) Notice: Subject to any disclaimer, the term of this patent is extended or adjusted under 35 U.S.C. 154(b) by 781 days.

(21) Appl. No.: 11/559,885

(22) Filed: Nov. 14, 2006

(65) Prior Publication Data
US 2007/0110187 A1      May 17, 2007

(30) Foreign Application Priority Data
Nov. 15, 2005   (TW) ............... 94140098 A

(51) Int. Cl.
  *H04L 5/12* (2006.01)
(52) U.S. Cl. .............. 375/261; 375/298; 375/316; 375/260; 375/233; 375/326; 375/265
(58) Field of Classification Search .......... 375/261, 375/222, 267, 340
See application file for complete search history.

(56) References Cited

U.S. PATENT DOCUMENTS

| | | | |
|---|---|---|---|
| 5,844,943 A | 12/1998 | Kazecki et al. | |
| 6,160,443 A | 12/2000 | Maalej | |
| 6,195,396 B1 * | 2/2001 | Fang et al. | 375/261 |
| 6,226,333 B1 * | 5/2001 | Spalink | 375/340 |
| 2003/0039318 A1 | 2/2003 | Tong | |
| 2005/0111563 A1 * | 5/2005 | Tseng | 375/261 |
| 2006/0274845 A1 | 12/2006 | Chiang et al. | |
| 2009/0086808 A1 * | 4/2009 | Liu et al. | 375/233 |

FOREIGN PATENT DOCUMENTS

| | | |
|---|---|---|
| JP | 2004-229269 | 8/2004 |
| TW | 494659 | 7/2002 |
| TW | 569557 | 1/2004 |
| TW | I229980 | 3/2005 |
| WO | 03/032596 A1 | 4/2003 |

OTHER PUBLICATIONS

Digital Multi-Programme Systems for Television, Sound and Data Services for Cable Distribution, pp. 1-60.

* cited by examiner

*Primary Examiner*—Shuwang Liu
*Assistant Examiner*—Dhaval Patel
(74) *Attorney, Agent, or Firm*—Winston Hsu

(57) ABSTRACT

A demapper, applied to a quadrature amplitude modulation trellis coded modulation (QAM-TCM) decoder, for generating more significant bits of a QAM signal according to the QAM signal and at least a less significant bit of the QAM signal is disclosed. The demapper includes a shifter for shifting the QAM signal to generate a shifted signal; a threshold value comparing and mapping unit for outputting at least a more-significant-bit buffered value; a sign bit decider for determining a sign value corresponding to the shifted signal; a multiplexer for generating a first more-significant-bit estimation and a second more-significant-bit estimation; and an operating unit for determining a third more-significant-bit estimation and a fourth more-significant-bit estimation.

15 Claims, 19 Drawing Sheets

| Shifting value($X_s, Y_s$) | ($C_3, C_0$) |
|---|---|
| (−1,−1) | (0,0) |
| (−1,1) | (0,1) |
| (1,−1) | (1,0) |
| (1,1) | (1,1) |

Fig. 5

| (C₄,C₀) | Shifting value(Xs,Ys) |
|---|---|
| (0,0) | (-1,-1) |
| (0,1) | (-1,1) |
| (1,0) | (1,-1) |
| (1,1) | (1,1) |

Fig. 15

DEMAPPER APPLIED TO QUADRATURE AMPLITUDE MODULATION TRELLIS CODED MODULATION DECODER AND RELATED METHOD

BACKGROUND OF THE INVENTION

1. Field of the Invention

The invention relates to a demapper and method thereof, and more particularly, to a demapper utilizing a known less significant bits to estimate the corresponding more significant bits and method thereof.

2. Description of the Prior Art

Please refer to FIG. 1. FIG. 1 is a block diagram of a prior art 64-Quadrature Amplitude Modulation Trellis Coded Modulation (64-QAM-TCM) encoder 10. The 64-QAM-TCM encoder 10 includes a parser 20, a differential encoder 22, a convolutional encoder 24, a puncturing unit 26, and a QAM mapper 28. When the parser 20 receives four symbols RS1, RS2, RS3, RS4 in order, the parser 20 will disorder bits inside the symbols RS1, RS2, RS3, RS4, and then reorder them and output the reordering result; wherein the in-phase and quadrature-phase more significant bits in these symbols RS1, RS2, RS3, RS4 are directly input to the QAM mapper 28 from the parser 20 without being encoded, while the in-phase and quadrature-phase least significant bits in the symbols RS1, RS2, RS3, RS4 are input to the QAM mapper 28 after being processes via the differential encoder 22, the convolutional encoder 24 and the puncturing unit 26. The above-mentioned QAM-TCM decoding technique is familiar to those of average skill in the art, and is further detailed in the publication, "Digital Multi-Programme Systems for Television, Sound and Data Services for Cable Distribution," ITU-T Recommendation J. 83. Therefore, further related descriptions are omitted for the sake of brevity.

The prior art has disclosed a QAM-TCM decoder for the purpose of processing the signal output from the above-mentioned QAM-TCM encoder; however, the prior art directly performs depuncturing and Viterbi decoding upon the in-phase and quadrature-phase bit streams X, Y received via a transmission channel. Consequently, the decoding processes that require a large number of calculations will thereby increase the complexity of the decoding operation. As to another prior art disclosure, a Viterbi decoder is utilized to decode the in-phase and quadrature-phase least significant bits of the received in-phase and quadrature-phase bit streams X, Y; and the remaining more significant bits are estimated through a referencing of Euclidean distances. However, estimation of each set (X,Y) requires determining the Euclidean distances between the set (X, Y) and a plurality of possible solutions. To achieve this estimation is costly, as it requires a great number of computations.

SUMMARY OF THE INVENTION

It is therefore an objective of the present invention to provide a demapper applied in a Quadrature Amplitude Modulation Trellis Coded Modulation decoder and method thereof, to solve the above-mentioned problems.

According to an embodiment of the present invention, a demapper is applied to a quadrature amplitude modulation trellis coded modulation (QAM-TCM) decoder for generating in-phase more significant bits and quadrature-phase more significant bits of a QAM signal according to the QAM signal, at least an in-phase less significant bit of the QAM signal, and at least a quadrature-phase less significant bit of the QAM signal is disclosed. The demapper includes: an in-phase threshold value comparing and mapping unit; a quadrature-phase threshold value comparing and mapping unit; a sign bit decider; a multiplexer coupled to the sign bit decider, the in-phase threshold value comparing and mapping unit and the quadrature-phase threshold value comparing and mapping unit; and an operating unit, coupled to the sign bit decider unit. The in-phase threshold value comparing and mapping unit is for generating at least an in-phase more-significant-bit buffered value according to a comparing result of a value of an in-phase component of the QAM signal and at least an in-phase threshold value of the QAM signal. The quadrature-phase threshold value comparing and mapping unit is for generating at least a quadrature-phase more-significant-bit buffered value according to a comparing result of a value of a quadrature-phase component of the QAM signal and at least a quadrature-phase threshold value of the QAM signal. The sign bit decider is for determining an in-phase sign and a quadrature-phase sign according to signs of the in-phase component and the quadrature-phase component. The multiplexer coupled to the sign bit decider, the in-phase threshold value comparing and mapping unit and the quadrature-phase threshold value comparing and mapping unit, is for generating a first more-significant-bit estimated value and a second more-significant-bit estimated value according to the in-phase sign, the quadrature-phase sign, the in-phase more-significant-bit buffered value and the quadrature-phase more-significant-bit buffered value. The operating unit coupled to the sign bit decider for determining a third more-significant-bit estimated value and a fourth more-significant-bit estimated value according to the in-phase less significant bits, the quadrature-phase less significant bits, the in-phase sign and the quadrature-phase sign; wherein the first more-significant-bit estimated value, the second more-significant-bit estimated value, the third more-significant-bit estimated value, and the fourth more-significant-bit estimated value correspond to different bits of the in-phase more significant bits or the quadrature-phase more significant bits.

According to the other embodiment of the present invention, a demapping method applied to a quadrature amplitude modulation trellis coded modulation (QAM-TCM) decoder for generating in-phase more significant bits and quadrature-phase more significant bits of a QAM signal according to the QAM signal, at least an in-phase less significant bits of the QAM signal, and at least a quadrature-phase less significant bit of the QAM signal is disclosed. The demapping method includes: generating at least an in-phase more-significant-bit buffered value according to a comparing result of a value of an in-phase component of the QAM signal and at least an in-phase threshold value of the QAM signal; generating at least a quadrature-phase more-significant-bit buffered value according to a comparing result of a value of a quadrature-phase component of the QAM signal and at least a quadrature-phase threshold value of the QAM signal; determining an in-phase sign and a quadrature-phase sign according to signs of the in-phase component and the quadrature-phase component; generating a first more-significant-bit estimated value and a second more-significant-bit estimated value according to the in-phase sign, the quadrature-phase sign, the in-phase more-significant-bit buffered value and the quadrature-phase more-significant-bit buffered value; and determining a third more-significant-bit estimated value and a fourth more-significant-bit estimated value according to the in-phase less significant bits, the quadrature-phase less significant bits, the in-phase sign and the quadrature-phase sign; wherein the first more-more-significant-bit estimated value, the second more-significant-bit estimated value, the third more-significant-bit estimated value and the fourth moresignificant-bit estimated value correspond to different bits of the in-phase more significant bits or the quadrature-phase more significant bits.

According to the other another embodiment of the present invention, a demapper applied to a quadrature amplitude modulation trellis coded modulation (QAM-TCM) decoder for generating in-phase more significant bits and quadrature-phase more significant bits of a QAM signal according to the QAM signal, at least an in-phase less significant bit of the QAM signal, and at least a quadrature-phase less significant bit of the QAM signal is disclosed. The demapper includes: a sign bit decider an in-phase mapping unit, and a quadrature-phase mapping unit. The sign bit decider is for determining a sign according to the QAM signal. The in-phase mapping unit is for generating a comparing result between the QAM signal and a plurality of threshold value, and generating a plurality of in-phase more-significant-bit estimated values according to the comparing result and the sign. The quadrature-phase mapping unit, is for proceeding executing a logical operation according to the sign, the in-phase and the quadrature-phase less-significant-bit, and generating a plurality of quadrature-phase more-significant-bit estimated values according to the logical operation result; wherein the in-phase more-significant-bit estimated values are corresponding to the in-phase more significant-bit, and the quadrature-phase more-significant-bit estimated values are corresponding to the quadrature-phase more-significant-bit.

According to the another embodiment of the present invention, a demapping method applied to a quadrature amplitude modulation trellis coded modulation (QAM-TCM) decoder is disclosed. The demapping method comprising: determining a reference sign according to a QAM signal; comparing the QAM signal and a plurality of threshold values to generate a comparing result, and generating a plurality of in-phase more-significant-bit estimated values according to the comparing result and the reference sign; proceeding executing a logical operation according to the reference sign, the in-phase and quadrature-phase least-significant-bit of the QAM signal, and generating a plurality of quadrature-phase more-significant-bit values according to the logical operation result; wherein the in-phase more-significant-bit estimated values corresponds to the in-phase more-significant-bit, and the quadrature-phase more-significant-bit estimated values corresponds to the quadrature-phase more-significant-bit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a look-up table of the shifting values corresponding to different $c_3$ and $c_0$.

FIG. 15 is look up table of the shifting value that corresponding to different $c_4$ and $c_0$.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

The following description details the operation of a 64-Quadrature Amplitude Modulation Trellis Coded Modulation (64-QAM-TCM) and a 256-QAM-TCM decoded applied to digital television systems as examples, where the respective specifications can be found in the published document titled, "Digital Multi-Programme Systems for Television, Sound and Data Services for Cable Distribution," ITU-T Recommendation J.83. However, those having average skill in the art of QAM-TCM decoders can easily realize that the present invention may also be applied in other fields. Furthermore, except for the 64-QAM and 256-QAM systems, the present invention is capable of being applied in the 1024-QAM-TCM system, which still obeys the spirit of the present invention.

Figure 1:
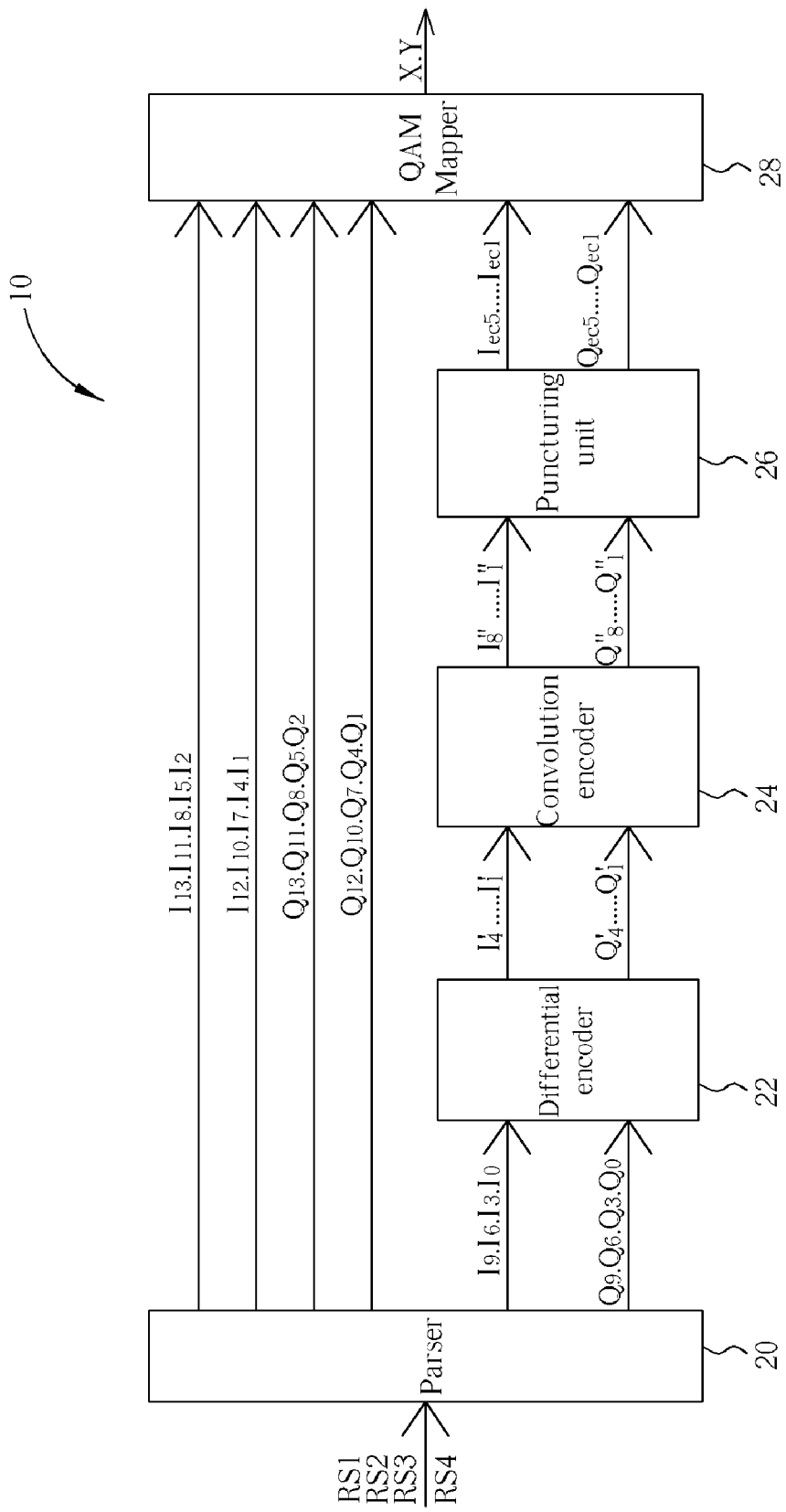
FIG. 1 is a block diagram of a prior art 64-Quadrature Amplitude Modulation Trellis Coded Modulation (64-QAM-TCM) encoder.
Figure 2:
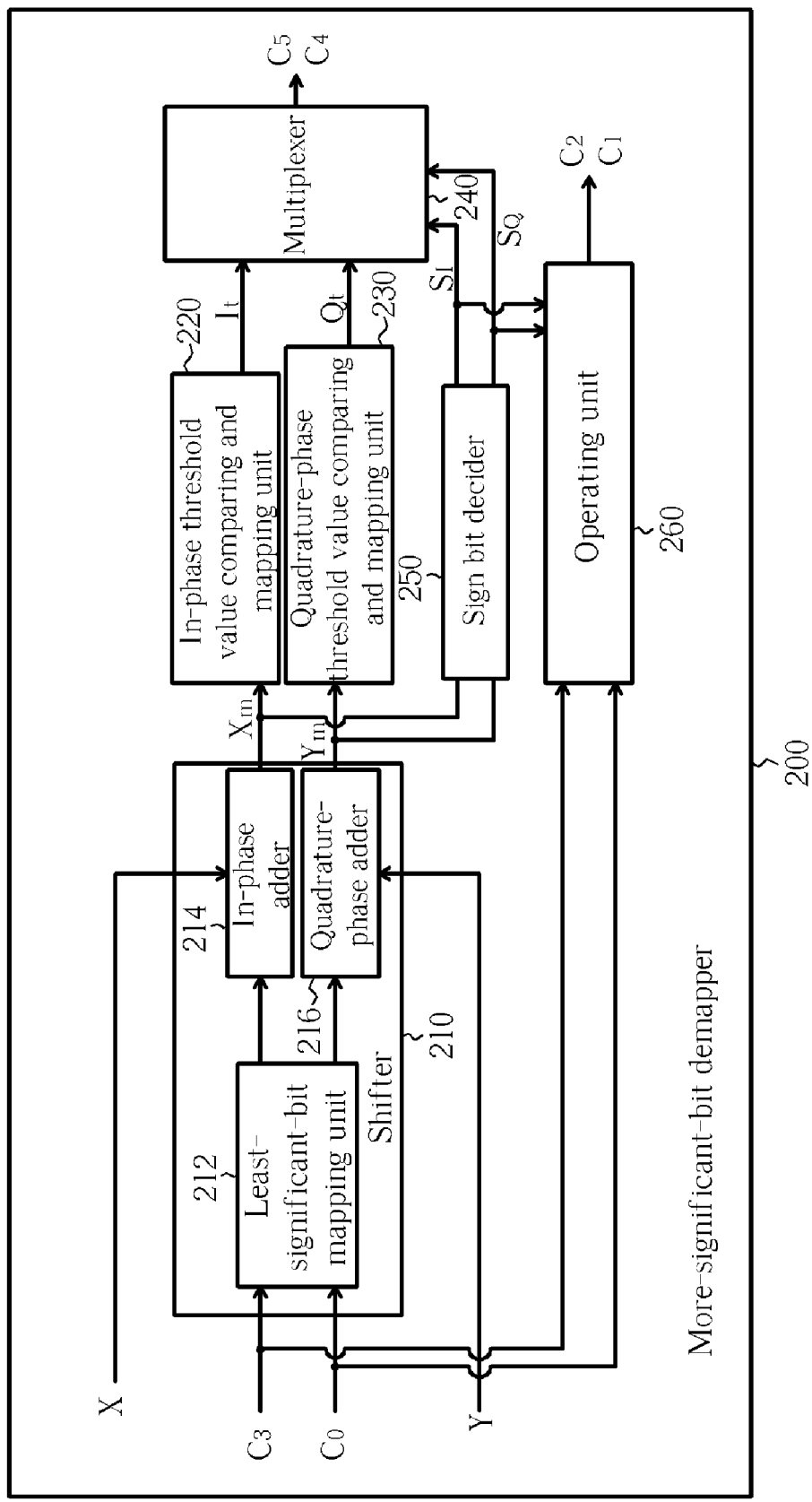
FIG. 2 is a block diagram of a 64-QAM-TCM more-significant-bit demapper according to an embodiment of the present embodiment.

Please refer to FIG. 2. FIG. 2 is a block diagram of a 64-QAM-TCM more-significant-bit demapper 200 according to an embodiment of the present embodiment. In this embodiment, the more-significant-bit demapper 200 is applied in a 64-QAM-TCM decoder (not shown). After a front-end circuit of the 64-QAM-TCM decoder (not shown) receives the QAM signal transmitted through the transmission channel, the front-end circuit performs the demodulating, the demapping and the least significant bit (LSB) decoding upon the received QAM signal, and then outputs a processed QAM signal (X, Y), an in-phase LSB $c_3$, and a quadrature-phase LSB $c_0$ to the 64-QAM-TCM more-significant-bit demapper 200. Because the in-phase and quadrature-phase more significant bits of the QAM signal (X, Y) are always affected by factors such as the channel variation to therefore contain errors, the more-significant-bit demapper 200 will further generate more significant bits of the corresponding QAM signal (X, Y) according to signals outputted from the above-mentioned front-end circuit.

Figure 3:
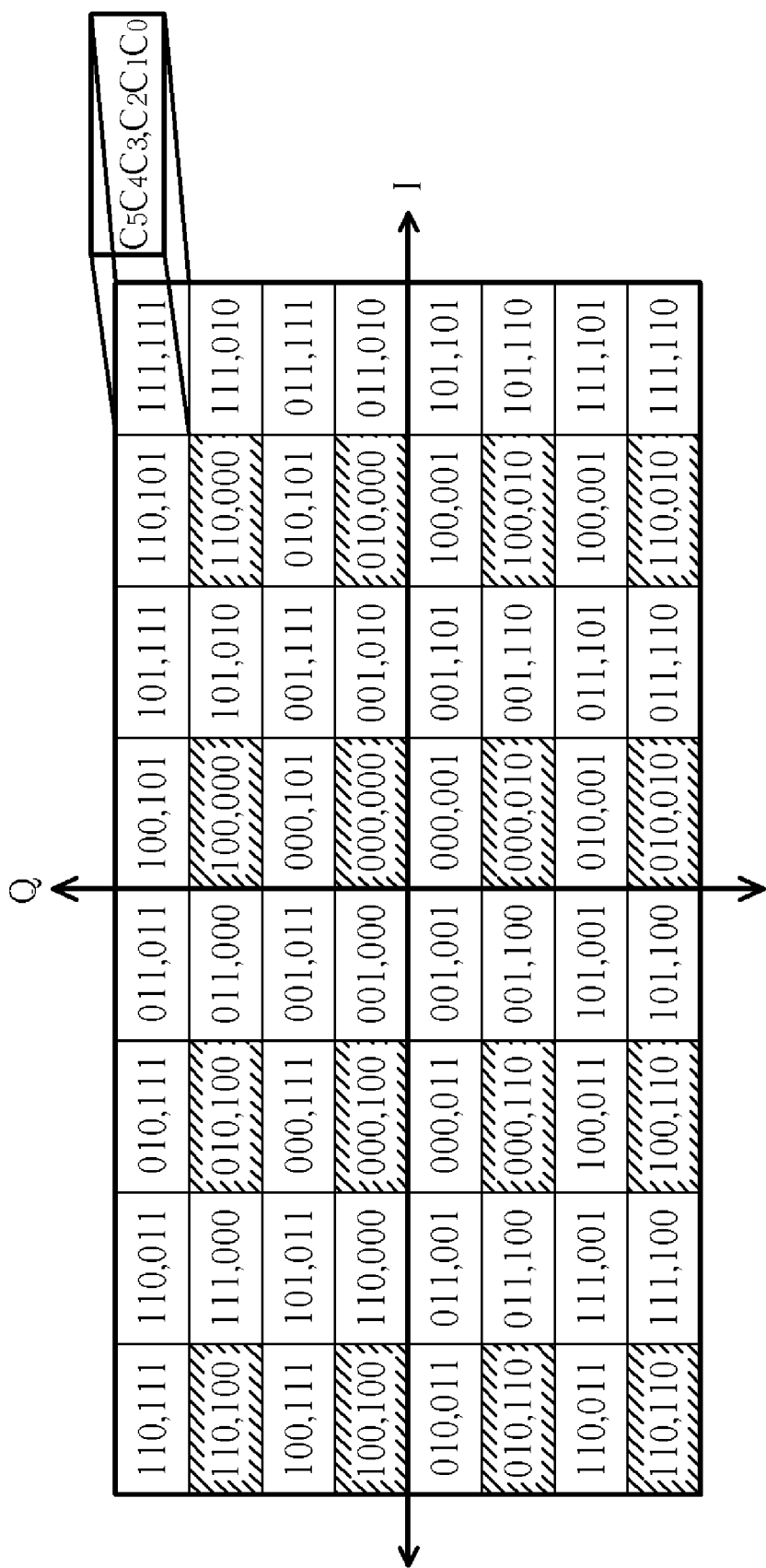
FIG. 3 is a diagram of the 64-QAM constellation.
Figure 4:
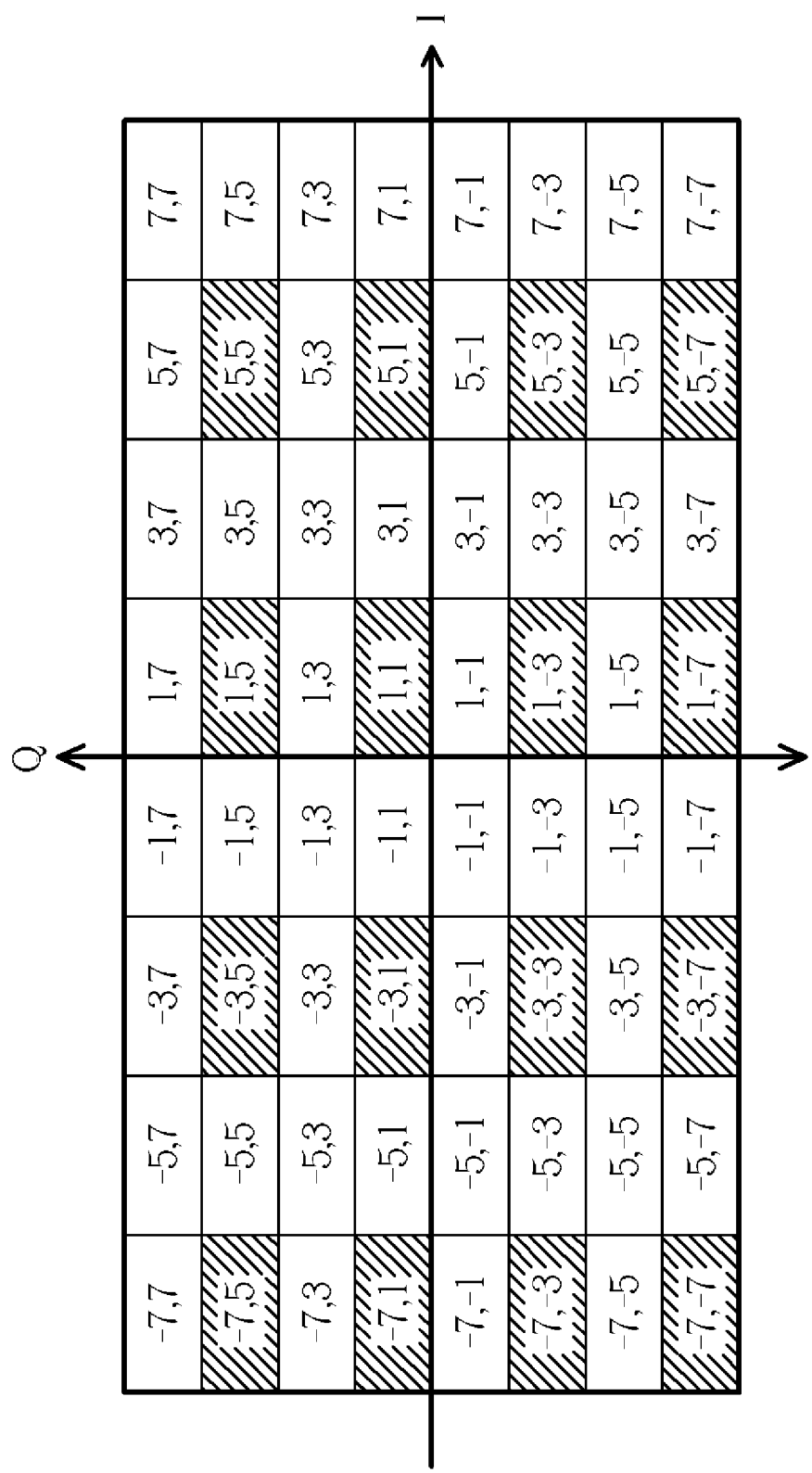
FIG. 4 is a modified diagram of the 64-QAM constellation.

As shown in FIG. 2, the more-significant-bit demapper 200 comprises a shifter 210, an in-phase threshold value comparing and mapping unit 220, a quadrature-phase threshold value comparing and mapping unit 230, a multiplexer 240, a sign bit decider 250, and an operating unit 260. The shifter 210 comprises a least-significant-bit mapping unit 212, an in-phase adder 214 and a quadrature-phase adder 216, wherein the least-significant-bit mapping unit 212 determines an in-phase shifting value and a quadrature-phase shifting value according to the in-phase LSB $c_3$ and the quadrature-phase LSB $c_0$, and the in-phase and quadrature-phase adders 214, 216 then shifts the QAM signal (X, Y) according to the in-phase and quadrature-phase shifting values to generate shifted QAM signal ($X_m$, $Y_m$) corresponding to the QAM signal (X, Y). Please refer to FIG. 3. FIG. 3 is a diagram of the 64-QAM constellation, where each trellis marked by oblique lines corresponds to six bits $c_5$ $c_4$ $c_3$ $c_2$ $c_1$ $c_0$. FIG. 4 is a modified diagram of the 64-QAM constellation, where each trellis corresponds to a specific QAM signal (X, Y). This embodiment assumes that the least significant bits ($c_3$, $c_0$) solved by the front-end circuit are (0, 0), respectively; therefore, in FIG. 4 and FIG. 3, trellises of oblique lines represent all of the possible QAM signals (X, Y) and the corresponding codewords under the condition where ($c_3$, $c_0$)=(0, 0). As one can see, the first quadrant in FIG. 3 corresponds to four possible codewords including (000, 000), (010, 000), (100, 000) and (110, 000), where these possible four codewords correspond to QAM signals (X, Y) equaling (1,1) (5, 1) (1, 5) and (5,5) respectively. Therefore, using the threshold value, X=3, is capable of determining the value of $c_4$ in a codeword is 1 or 0. For example, for (X, Y)=(5, 1) and (X, Y)=(5, 5) of the QAM signals, the values of X are all greater than 3, thus the values of $c_4$ in codewords are all 1's; for (X, Y)=(1, 1) and (X, Y)=(1, 5) of the QAM signals, the values of X are all less than 3, thus the values of $c_4$ in codewords are all 0's. In other words, if the value of X in a QAM signal is greater than 3, then $c_4$=1; otherwise, $c_4$=0. Similarly, using the threshold value, Y=3, is capable of determining the value of $c_5$ in a codeword is 1 or 0. For example, for (X, Y)=(1, 5) and (X, Y)=(5, 5) of the QAM signals, the values of Y are all greater than 3, thus the value of $c_5$ in codewords are all 1's; for (X, Y)=(1, 1) and (X, Y)=(5, 1) of the QAM signals, the values of Y are all less than 3, thus the values of $c_5$ in codewords are all 0's. In other words, if the value of Y in a QAM signal is greater than 3, then $c_5$=1; otherwise, $c_5$=0.

The above-mentioned determining conditions for $c_5$, $c_4$ of codewords in the first quadrant have counterpart determining conditions for the second, third, and fourth quadrants. Taking the second quadrant in FIG. 3 for example, the four possible codewords including (000, 100), (100, 100), (010, 100) and (110, 100), where the possible four codewords correspond to (−3,1) (−7, 1) (−3, 5) and (−7,5) of the QAM signals (X, Y) respectively. Therefore, the threshold value, X=−5, is capable of determining the value of $c_5$ in a codeword is 1 or 0; the threshold value, Y=3, is capable of determining the value of $c_4$ in a codeword is 1 or 0. For example, for (X, Y)=(−7, 1) and (X, Y)=(−7, 5) of the QAM signals, the values of X are all less than −5, thus the values of $c_5$ in codewords are all 1's; for (X, Y)=(−3, 1) and (X, Y)=(−3, 5) of the QAM signals, the values of X are all greater than −5, thus the values of $c_5$ in a codeword are all 0's; for (X, Y)=(−3, 1) and (X, Y)=(−7, 1) of the QAM signals, the values of Y are all less than 3, thus the values of $c_4$ in codewords are all 0'; for (X, Y)=(−3, 5) and (X, Y)=(−7, 5) of the QAM signals, the values of Y are all greater than 3, thus the values of $c_4$ in codewords are all 1's. In other words, in the second quadrant, the threshold values are set using (X, Y)=(−5, 3); similarly, in the third quadrant, the threshold values are set using (X, Y)=(−5, −5); in the fourth quadrant, the threshold values are set using (X, Y)=(3, −5). As mentioned above, different quadrants require four different threshold value settings respectively, and $c_3$ and $c_5$ in codewords comprise four possible combinations. Therefore, if the above-mentioned characteristic is used to determine the values of $c_4$ and $c_5$, then the system requires 16 sets of different threshold values for different quadrants and different combinations of values of $c_3$ and $c_0$ in addition to utilizing the sign of the QAM signal (X, Y) to determine the quadrants to which $c_4$ and $c_5$ correspond. However, in this embodiment, if the origin of the coordinate is first shifted to (−1, −1), then the threshold values (3, 3), (−5, 3), (−5, −5) and (3, −5) of the four quadrants are changed to (4, 4), (−4, 4), (−4, −4), and (4, −4) respectively. In other words, after the origin is shifted, the absolute values of the threshold values of the four quadrants will be fixed values (4, 4). This means that for different combination of codeword $c_3$ and $c_0$, after a normalization upon the corresponding coordinate by shifting the origin with specific shifting values, the absolute values of the threshold values for determining $c_5$ and $c_4$ are unified as (4, 4). Furthermore, if the absolute values of all values in the QAM signal are computed after the coordinate normalization, then all of the determinations can be viewed as acting upon the first quadrant. Then, after the threshold values determine the buffered value of more significant bits, the estimation of more significant bits $c_5$ and $c_4$ are completed by referencing signs of $c_3$ and $c_0$ and demapping the buffered value of the more significant bits to a corresponding original quadrant.

Please refer to FIG. 5. FIG. 5 is a look-up table of the shifting values corresponding to different $c_3$ and $c_0$. The least-significant-bit mapping unit 212 performs a mapping operation according to the look-up table to determine a set of shifting values ($x_s$, $y_s$), and then the in-phase and quadrature-phase adders 214 and 216 shift the QAM signal according to the determined shifting values ($x_s$, $y_s$). The shifted QAM signal ($X_m$, $Y_m$) is inputted to the in-phase threshold value comparing and mapping unit 220 and quadrature-phase threshold value comparing and mapping unit 230, as shown in FIG. 2. Furthermore, in order to unify the threshold values for determining $c_5$ and $c_4$ (i.e., in order to make the determinations act upon the first quadrant), the in-phase threshold value comparing and mapping unit 220 and the quadrature-phase threshold value comparing and mapping unit 230 take the absolute values of the shifted QAM signal $X_m$ and shifted QAM signal $Y_m$, respectively, to generate the QAM signal $|X_m|$ and the QAM signal $|Y_m|$, and then proceed to the determination and mapping steps. In this embodiment of the present invention, the determination and mapping steps are performed by a bit selector. In a 64-QAM system, however, the threshold value for determining $c_5$, $c_4$ is set to 4 according to the aforementioned description, and the shifted QAM signal ($|X_m|$, $|Y_m|$) is a digital signal including binary bits; therefore, the threshold value, which is equal to 4, corresponds to the third bit of the integer part of QAM signal $|X_m|$ or QAM signal $|Y_m|$, that is, the third bit counting from the least significant bit in the integer part; for example, for a set of digital signals 000, 001, 010 and 011, the third bits of the integer part are all 0's; and for a set of digital signals 100, 101, 110 and 111, the third bits of the integer part are all 1's. If the third bit is 0, it means that the value of QAM signal $|X_m|$ or QAM signal $|Y_m|$ is less than 4; on the contrary, if the third bit is 1, it means that the value of QAM signal $|X_m|$ or QAM signal $|Y_m|$ is greater than 4. Therefore, if the third bit of the integer part of QAM signal $|X_m|$ is 1, the in-phase threshold value comparing and mapping unit 220 then outputs an in-phase more-significant-bit buffered value $I_t=1$; on the contrary, if the third bit of the integer part of QAM signal $|X_m|$ is 0, the in-phase threshold value comparing and mapping unit 220 then outputs the in-phase more-significant-bit buffered value $I_t=0$. If the third bit of the integer part of QAM signal $|Y_m|$ is 1, the quadrature-phase threshold value comparing and mapping unit 230 then outputs a quadrature-phase more-significant-bit buffered value $Q_t=1$; on the contrary, if the third bit of the integer part of QAM signal $|Y_m|$ is 0, the quadrature-phase threshold value comparing and mapping unit 230 then outputs a quadrature-phase more-significant-bit buffered value $Q_t=0$. Please note that, the above-mentioned embodiments of the in-phase threshold value comparing and mapping unit 220 and quadrature-phase threshold value comparing and mapping unit 230 are just meant to be examples and not meant to be taken as limitations of the present invention.

Figure 6:
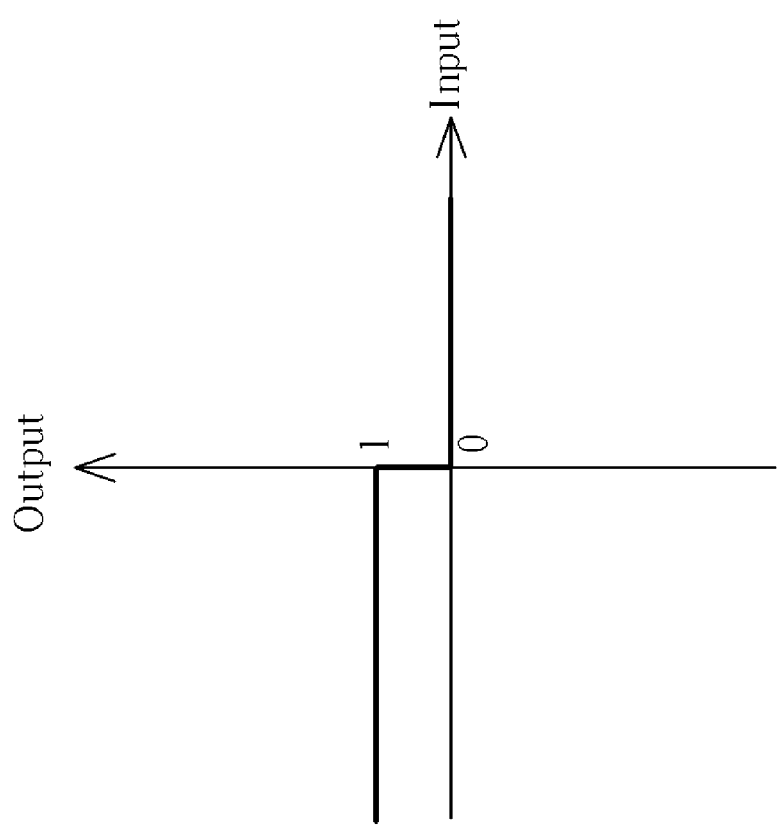
FIG. 6 is a diagram illustrating the input-output relationship of the sign bit decider shown in FIG. 2.

The shifted QAM signal $(X_m, Y_m)$ is further inputted to the sign bit decider 250 to generate an in-phase sign $S_1$ and a quadrature-phase sign $S_Q$. Please refer to FIG. 6. FIG. 6 illustrates the input-output relationship of the sign bit decider 250 shown in FIG. 2. As shown in FIG. 6, when an input signal is not less than 0, the "sign" is deemed as positive, and the sign decider 250 outputs a 0; however, when the input signal is less than 0, the "sign" is deemed as negative, and the sign bit decider 250 outputs a 1. Finally, the multiplexer 240 receives the in-phase more-significant-bit buffered value $I_t$, the quadrature-phase more-significant-bit buffered value $Q_t$, the in-phase sign $S_1$ and the quadrature-phase sign $S_Q$ to generate the estimated values of $c_5$ and $c_4$; in other words, the multiplexer 240 demaps the in-phase more-significant-bit buffered value $I_t$ and the quadrature-phase more-significant-bit buffered value $Q_t$ to corresponding original quadrant to obtain the estimated values of $c_5$ and $c_4$ according to the in-phase sign $S_1$ and the quadrature-phase sign $S_Q$. In this embodiment, the in-phase more-significant-bit buffered value $I_t$ and the quadrature-phase more-significant-bit buffered value $Q_t$ would probably map to any point marked by oblique lines in the first quadrant shown in FIG. 3; furthermore, any of these 4 points will have a corresponding demapping point in each of the second, third and fourth quadrants. Please refer to FIG. 3 and FIG. 4 at the same time. Taking (1, 5), which corresponds to the codeword (100, 000), for example, the demapping point in the second quadrant is (-3, 5), which corresponds to the codeword (010, 100); the demapping point in the third quadrant is (-3, -7), which corresponds to the codeword (100, 110); and the demapping point in the fourth quadrant is (1, -7), which corresponds to the codeword (010, 010). Therefore, after observing values of $c_5$ and $c_4$ in different quadrants, one can realize that $c_5$ and $c_4$ of the demapping point in the third quadrant are that same as that of the demapping point in the first quadrant, and $c_5$ and $c_4$ of the demapping points in the second and the fourth quadrants are different from that of the demapping point in the first quadrant. Therefore, in this embodiment of the present invention, the multiplexer 240 is actually determining whether the in-phase sign $S_1$ and the quadrature-phase sign $S_Q$ are equal. If the in-phase sign $S_1$ and the quadrature-phase sign $S_Q$ are equal (i.e., corresponding to the first or the third quadrant), then the estimated $c_5$ and $c_4$ are $(I_t, Q_t)$, respectively; on the other hand, if the in-phase sign $S_1$ and quadrature-phase sign $S_Q$ are not equal (i.e., corresponding to the second or the fourth quadrant), then the estimated $c_5$ and $c_4$ are $(Q_t, I_t)$, respectively.

Figure 7:
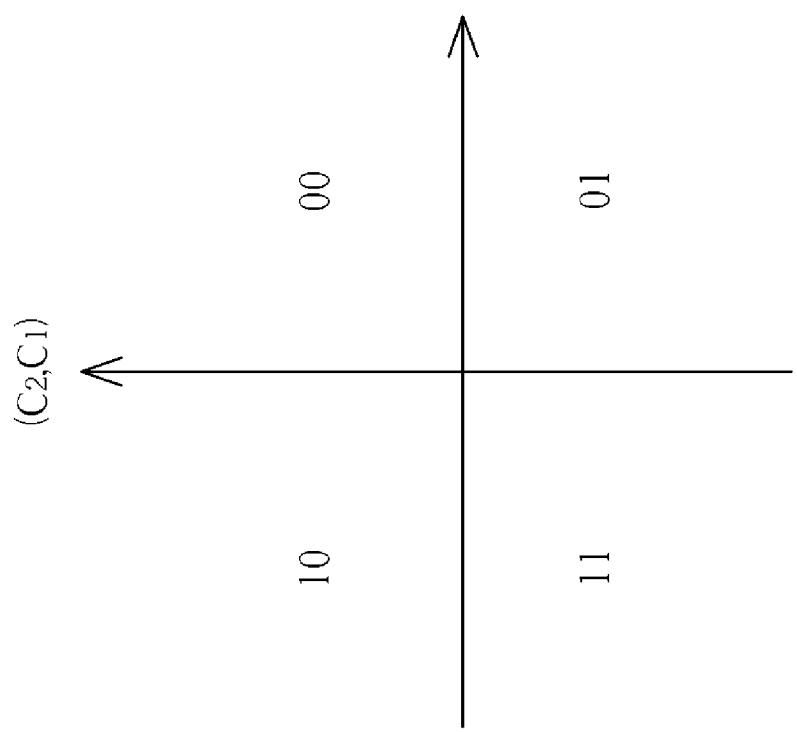
FIG. 7 is a diagram illustrating values of $c_2$ and $c_1$ corresponding to different quadrants when $(c_3, c_0)=(0, 0)$.
Figure 8:
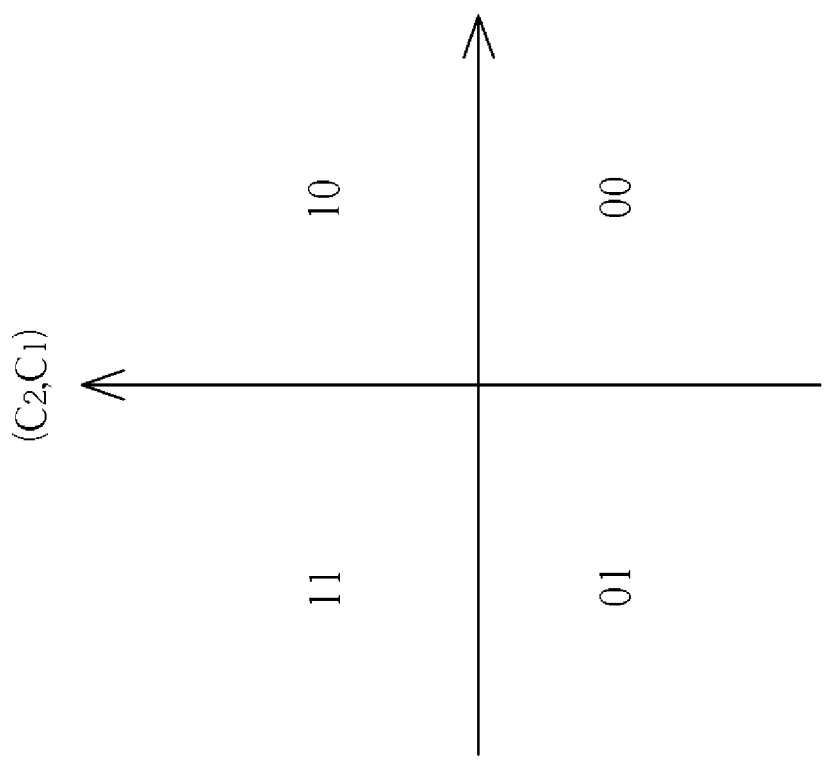
FIG. 8 is a diagram illustrating values of $c_2$ and $c_1$ corresponding to different quadrants when $(c_3, c_0)=(0, 1)$.
Figure 9:
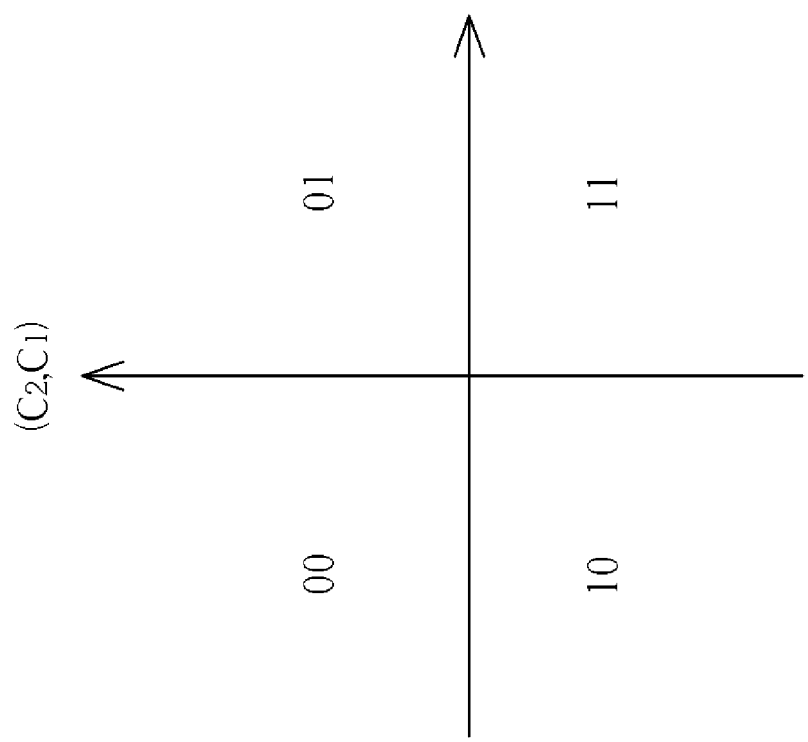
FIG. 9 is a diagram illustrating values of $c_2$ and $c_1$ corresponding to different quadrants when $(c_3, c_0)=(1, 0)$.
Figure 10:
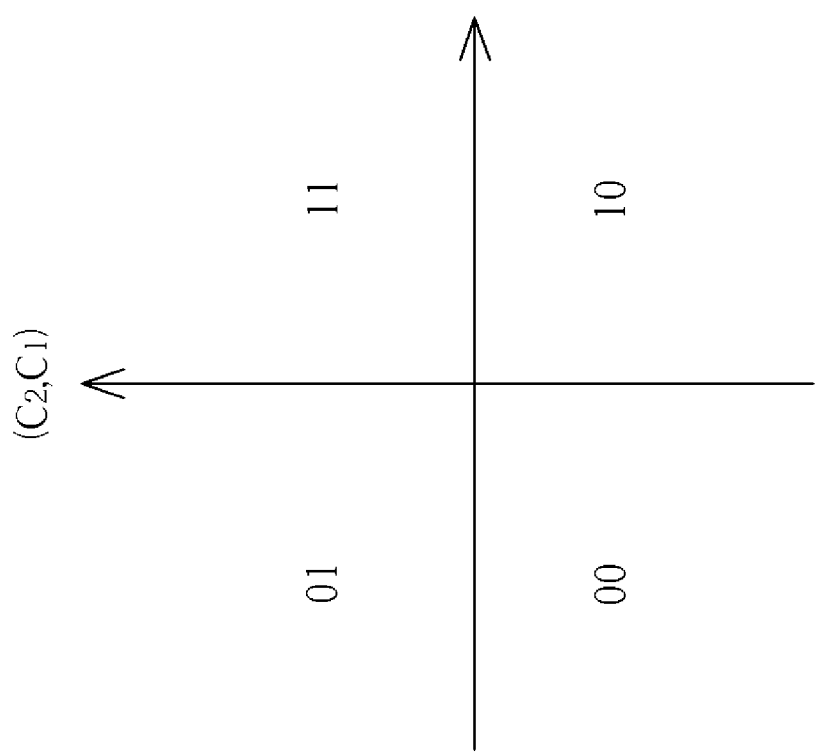
FIG. 10 is a diagram illustrating values of $c_2$ and $c_1$ corresponding to different quadrants when $(c_3, c_0)=(1, 1)$.

The description below further illustrates the operation of the operating unit 260. The operating unit 260 receives the in-phase LSB $c_3$, the quadrature-phase LSB $c_0$, the in-phase sign $S_I$ and the quadrature-phase sign $S_Q$ to determine the values of $c_2$ and $c_1$. Please refer to FIG. 7. FIG. 7 is a diagram illustrating values of $c_2$ and $c_1$ corresponding to different quadrants when $(c_3, c_0)=(0, 0)$. The corresponding quadrants of $c_2$ and $c_1$ are determined by the in-phase sign $S_I$ and the quadrature-phase sign $S_Q$; in other words, when $(S_I, S_Q)=(1, 1)$, codeword $(c_2, c_1)$ corresponds to 00; when $(S_I, S_Q)=(0, 1)$, codeword $(c_2, c_1)$ corresponds to 10; when $(S_I, S_Q)=(0, 0)$, codeword $(c_2, c_1)$ corresponds to 11; and when $(S_I, S_Q)=(1, 0)$, codeword $(c_2, c_1)$ corresponds to 01. Similarly, when $(c_3, c_0)=(0, 1)$, the values of $c_2$ and $c_1$ corresponding to different quadrants are illustrated in FIG. 8; when $(c_3, c_0)=(1, 0)$, the values of codeword $c_2$ and $c_1$ corresponding to different quadrants are illustrated in FIG. 9; when $(c_3, c_0)=(1, 1)$, the values of $c_2$ and $c_1$ corresponding to different quadrants are illustrated in FIG. 10. The relations shown in FIGS. 7 through 10 can be represented by equations as shown below:

$$c_2 = \overline{(c_0 \oplus c_3)} \cdot (c_0 \oplus S_I) + (c_0 \oplus c_3) \cdot (c_0 \oplus S_Q) \tag{1}$$

$$c_1 = \overline{(c_0 \oplus c_3)} \cdot (c_3 \oplus S_Q) + (c_0 \oplus c_3) \cdot (c_3 \oplus S_I) \tag{2}$$

In equations (1) and (2) please reference the following notations: "⁻" indicates the NOT operator, ⊕ indicates an exclusive OR (XOR) operator, · indicates an AND operator, and + indicates an OR operator. Please note that, the results shown in FIGS. 7 through 10 can be obtained by rotating the coordinate; for the example, the result of FIG. 8 can be obtained from FIG. 7 by rotating the coordinate 90° counter-clockwise, and the result of FIG. 10 can be obtained from FIG. 9 by rotating the coordinate 90° counter-clockwise. For the fact that the results in FIGS. 7 through 10 can be obtained by rotating the coordinate, the present invention just only needs one circuit to solve for the values of $c_1$ and $c_2$ in four different conditions, that is, $(c_3, c_0)=(0, 0), (1, 0), (0, 1), (1, 1)$, which greatly reduces the cost of the circuit implementation.

Figure 11:
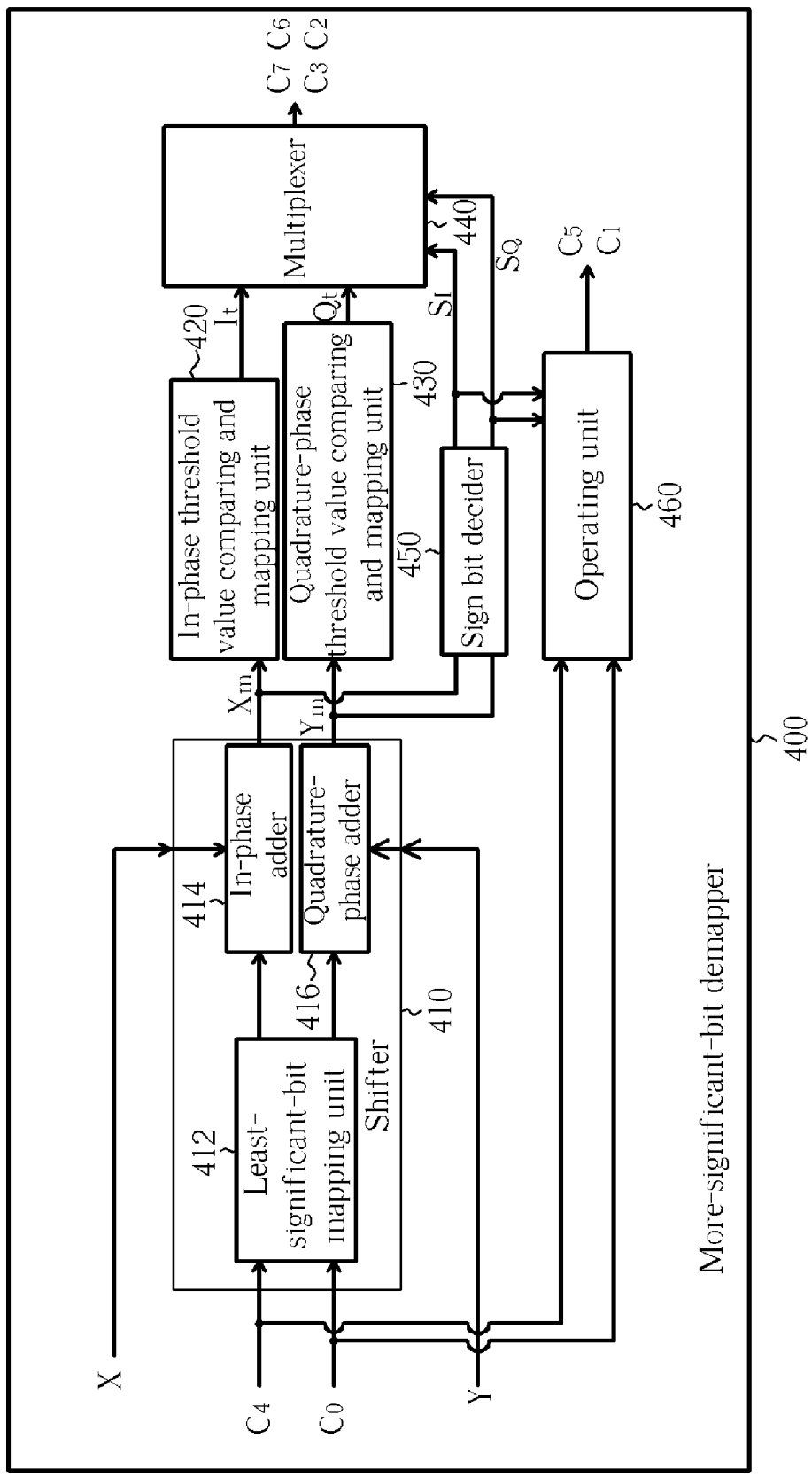
FIG. 11 is a block diagram of a 256-QAM-TCM more-significant-bit demapper according to an embodiment of the present invention.
Figure 12:
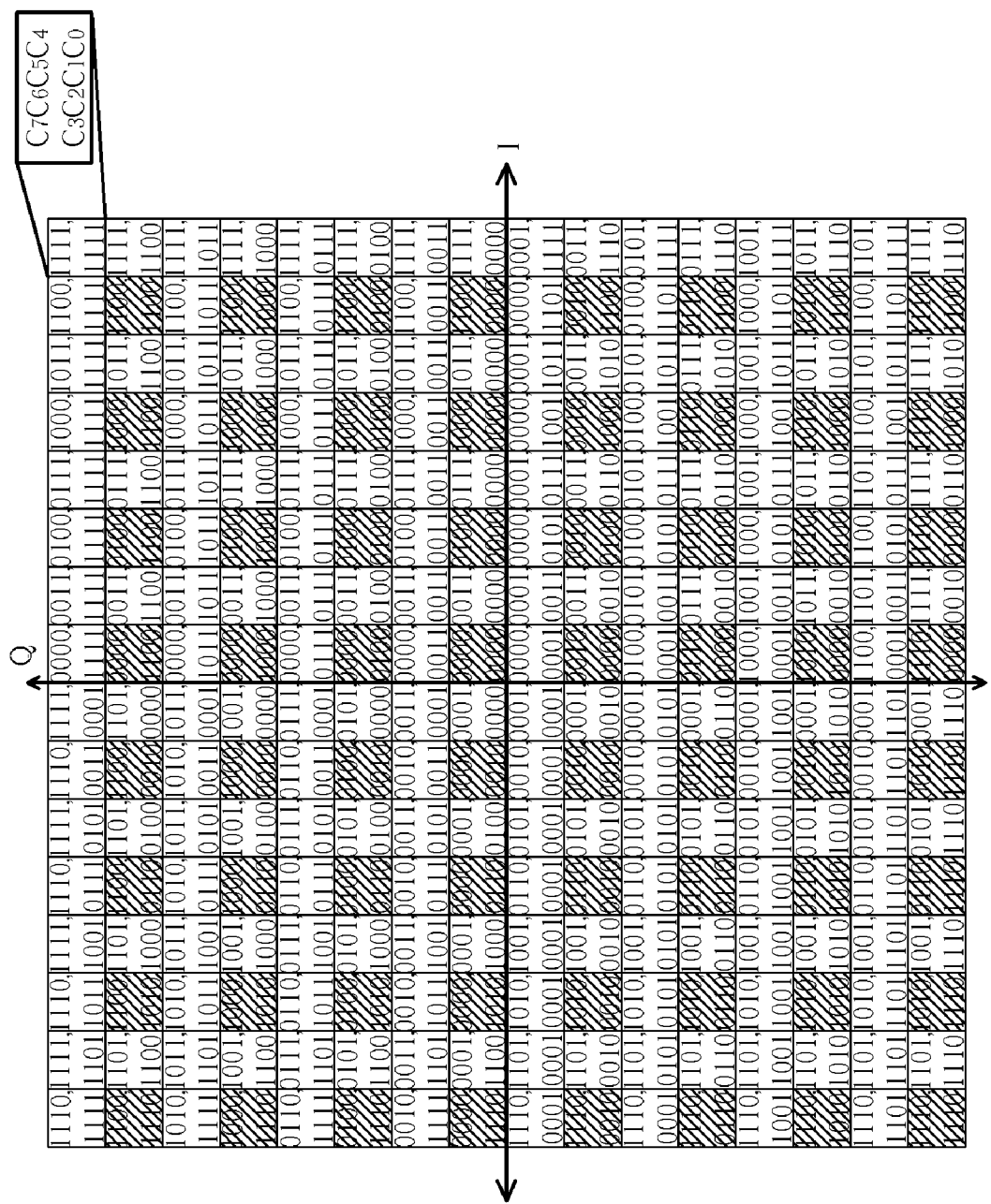
FIG. 12 is a diagram illustrating a 256-QAM constellation.
Figure 13:
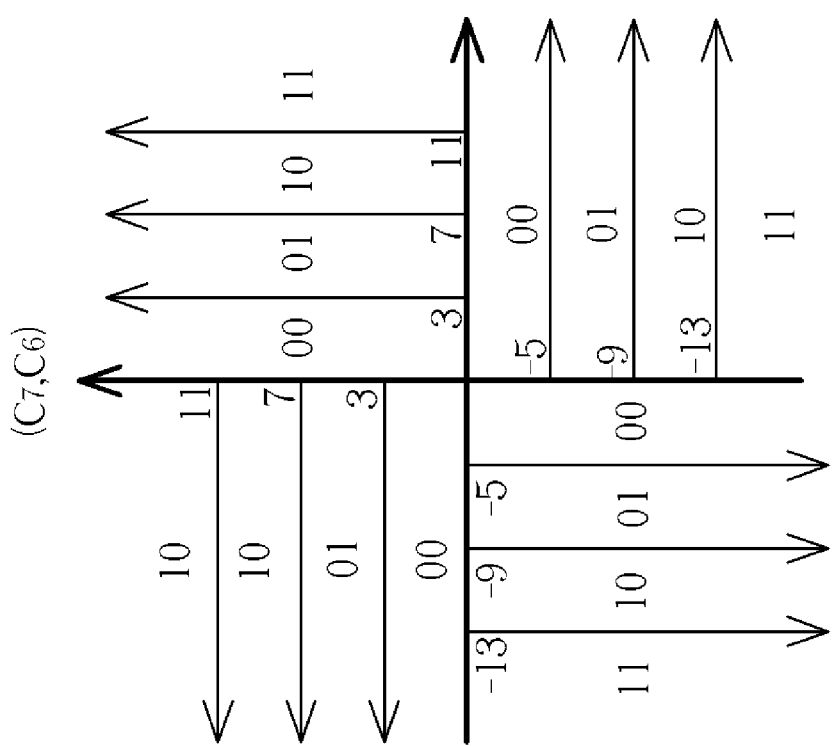
FIG. 13 illustrates a diagram for determining threshold value of $c_7$ and $c_6$ in 256-QAM-TCM more bits demapper of FIG. 11.
Figure 14:
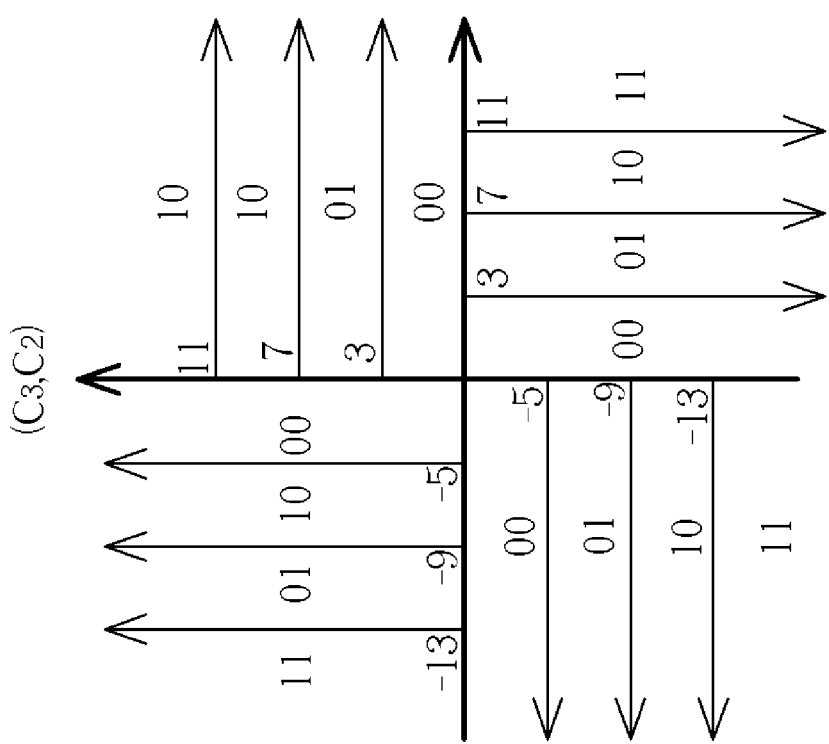
FIG. 14 is a diagram illustrating the determining threshold value of $c_3$ and $c_2$ in 256-QAM-TCM more bits demapper of FIG. 11.

Please refer to FIG. 11. FIG. 11 is a block diagram of a 256-QAM-TCM more-significant-bit demapper 400 according to an embodiment of the present embodiment. The operating principles of the more-significant-bit demapper 400 and the more-significant-bit demapper 200 are almost the same; however, the practical implementations of threshold value comparing and mapping units, the multiplexer, and the operating unit differ from one another. The description below briefly illustrates the parts that are similar and the parts that are different in greater detail. The least-significant-bit mapping unit 412 of the shifter 410 determines an in-phase shifting value and a quadrature-phase shifting value according to the in-phase LSB $c_4$ and the quadrature-phase LSB $c_0$ generated by a front-end circuit (not shown), and then the in-phase and quadrature-phase adders 414, 416 shift the QAM signal $(X, Y)$ according to the in-phase and quadrature-phase shifting values to generate a shifted QAM signal $(X_m, Y_m)$. Please refer to FIG. 12. FIG. 12 is a diagram illustrating a 256-QAM constellation, where the regions marked by oblique lines represent the possible codewords corresponding to all QAM signals $(X, Y)$ under the condition where $(c_4, c_0)=(0, 0)$. Referring to above description for 64-QAM, within the 16 possible codewords in the first quadrant, $c_7$ and $c_6$ can be determined by using threshold values shown in FIG. 13, and $c_3$ and $c_2$ can be determined by using threshold values shown in FIG. 14; however, under the condition where $(c_4, c_0)=(0, 0)$, if the origin of the coordinate is shifted to $(-1, -1)$ firstly, then the threshold values of different quadrants shown in FIG. 13 and FIG. 14 are normalized to 4, 8, 12, which is similar to the normalization process mentioned in the above 64-QAM-TCM example. Please refer to FIG. 15. FIG. 15 is a look-up table of combinations of different c4 and c0 corresponding to the shifting values (xs, ys). Similarly, in the combinations of different c4 and c0, the unified threshold value can be obtained by performing the normalization operation through shifting the coordinate of the 256-QAM constellation according to the look-up table.

The output of the shifter 410 (i.e., the shifted QAM signal $(X_m, Y_m)$) is inputted to the in-phase threshold value comparing and mapping unit 420 and the quadrature-phase threshold value comparing and mapping unit 430 to generate an in-phase more-significant-bit buffered value $I_t$ and a quadrature-phase more-significant-bit buffered value $Q_t$. Similar to the in-phase threshold value comparing and mapping unit 220 and the quadrature-phase threshold value comparing and mapping unit 230, the in-phase threshold value comparing and mapping unit 420 and the quadrature-phase threshold value comparing and mapping unit 430 take the absolute values of the shifted QAM signal $(X_m, Y_m)$ first to generate the QAM signal $(|X_m|, |Y_m|)$, and then proceeds with the threshold value comparison for the QAM signal $|X_m|$ and the QAM signal $|Y_m|$. If the value of the QAM signal $|X_m|$ is less than 4, then the in-phase threshold value comparing and mapping unit 420 generates the in-phase more-significant-bit buffered value $I_t=00$; if the value of QAM signal $|X_m|$ is greater than 4 and less than 8, then the in-phase threshold value comparing and mapping unit 420 generates the in-phase more-significant-bit buffered value $I_t=01$; if the value of QAM signal $|X_m|$ is greater than 8 and less than 12, then the in-phase threshold value comparing and mapping unit 420 generates the in-phase more-significant-bit buffered value $I_t=10$; if the value of QAM signal $|X_m|$ is greater than 12, then the in-phase threshold value comparing and mapping unit 420 generates the in-phase more-significant-bit buffered value $I_t=11$. Similarly, if the value of QAM signal $|Y_m|$ is less than 4, then the quadrature-phase threshold value comparing and mapping unit 430 generates the quadrature-phase more-significant-bit buffered value $Q_t=00$; if the value of QAM signal $|Y_m|$ is greater than 4 and less than 8, then the quadrature-phase threshold value comparing and mapping unit 430 generates the quadrature-phase more-significant-bit buffered value $Q_t=01$; if the value of QAM signal $|Y_m|$ is greater than 8 and less than 12, then the quadrature-phase threshold value comparing and mapping unit 430 generates the quadrature-phase more-significant-bit buffered value $Q_t=10$; if the value of QAM signal $|Y_m|$ is greater than 12, then the quadrature-phase threshold value comparing and mapping unit 430 generates the quadrature-phase more-significant-bit buffered value $Q_t=11$. The threshold values for decoding $c_7$, $c_6$ and $c_3$, $c_2$ are set to 4, 8, 12, and the shifted QAM signal $(|X_m|, |Y_m|)$ is a digital signal having binary bits; therefore, threshold values 4, 8, 12 are equivalent to the third and the fourth bits of the integer part of QAM signal $|X_m|$ or QAM signal $|Y_m|$, that is, the third and the fourth bit counting from the least significant bit in the integer portion of the digital signal. If the two bits are 00, this means that the value of QAM signal $|X_m|$ or QAM signal $|Y_m|$ is less than 4; if the two bits are 01, it means that the value of QAM signal $|X_m|$ or QAM signal $|Y_m|$ is greater than 4 and less than 8; if the two bits are 10, it means that the value of QAM signal $|X_m|$ or QAM signal $|Y_m|$ is greater than 8 and less than 12; if the two bits are 11, it means that the value of QAM signal $|X_m|$ or QAM signal $|Y_m|$ is greater than 12. Therefore, in the in-phase threshold value comparing and mapping unit 420, the values of the third and the fourth bits in the integer part of QAM signal $|X_m|$ are equal to the in-phase more-significant-bit buffered value $I_t$; the values of the third and the fourth bits in the integer part of QAM signal $|Y_m|$ are equal to the quadrature-phase more-significant-bit buffered value $Q_t$. Please note that, the above-mentioned embodiments of the in-phase threshold value comparing and mapping unit 420 and quadrature-phase threshold value comparing and mapping unit 430 only serve as examples and are not meant to be taken as limitations of the present invention.

The shifted QAM signal $(X_m, Y_m)$ is further inputted to the sign bit decider 450 to generate an in-phase sign $S_I$ and a quadrature-phase sign $S_Q$, where the operation of the sign bit decider 450 is the same as that of the sign bit decider 250. Therefore, when the input signal is not less than 0, the output of the sign bit decider 450 is 0, and when the input signal is less than 0, the output of the sign bit decider 450 is 1. The multiplexer 440 receives the in-phase more-significant-bit buffered value $I_t$, the quadrature-phase more-significant-bit buffered value $Q_t$, the in-phase sign $S_I$ and the quadrature-phase sign $S_Q$ to generate the estimated values of $c_7$, $c_6$ and $c_3$, $c_2$; in other words, the multiplexer 440 demaps the in-phase more-significant-bit buffered value $I_t$ and the quadrature-phase more-significant-bit buffered value $Q_t$ into corresponding original quadrant to obtain estimated values of $c_7$, $c_6$ and $c_3$, $c_2$ according to the in-phase sign $S_I$ and the quadrature-phase sign $S_Q$. Similarly, through observing the operation of the above-mentioned more-significant-bit demapper 200, one can realize that when $c_7$, $c_6$, $c_3$, $c_2$ are located at the first or the third quadrant, the estimated values of $c_7$, $c_6$ are the in-phase more-significant-bit buffered value $I_t$ and the estimated values of $c_3$, $c_2$ are the quadrature-phase more-significant-bit buffered value $Q_t$; when $c_7$, $c_6$, $c_3$, $c_2$ are located at the second or the fourth quadrant, the estimated values of $c_7$, $c_6$ are the in-phase more-significant-bit buffered value $I_t$ and the estimated values of $c_3$, $c_2$ are the quadrature-phase more-significant-bit buffered value $Q_t$. Therefore, in this embodiment, the multiplexer 440 is actually determining whether the in-phase sign $S_I$ and quadrature-phase sign $S_Q$ are equal. If the in-phase sign $S_I$ and the quadrature-phase sign $S_Q$ are equal, then the estimated codeword $(c_7c_6, c_3c_2)$ is $(I_t, Q_t)$; on the contrary, if the in-phase sign $S_I$ and the quadrature-phase sign $S_Q$ are not equal, then the estimated codeword $(c_7c_6, c_3c_2)$ is (Qt, It).

Figure 16:
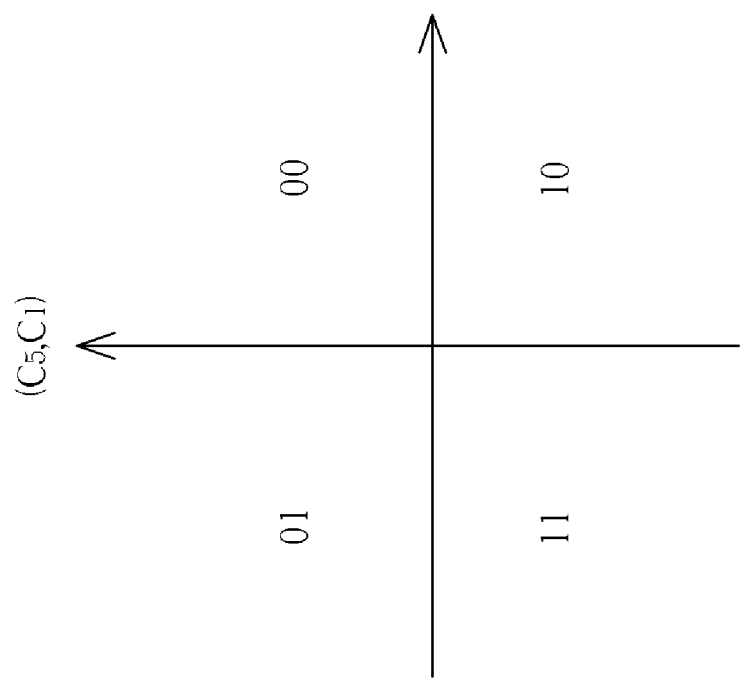
FIG. 16 is a diagram illustrating values of $c_5$ and $c_1$ corresponding to different quadrants when $(c_4, c_0)=(0, 0)$.
Figure 17:
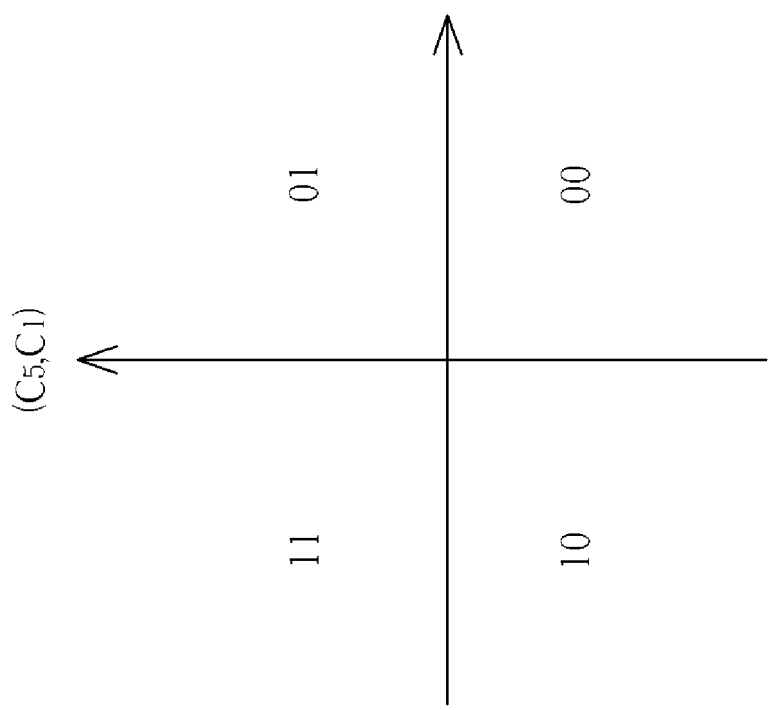
FIG. 17 is a diagram illustrating values of $c_5$ and $c_1$ corresponding to different quadrants when $(c_4, c_0)=(0, 1)$.
Figure 18:
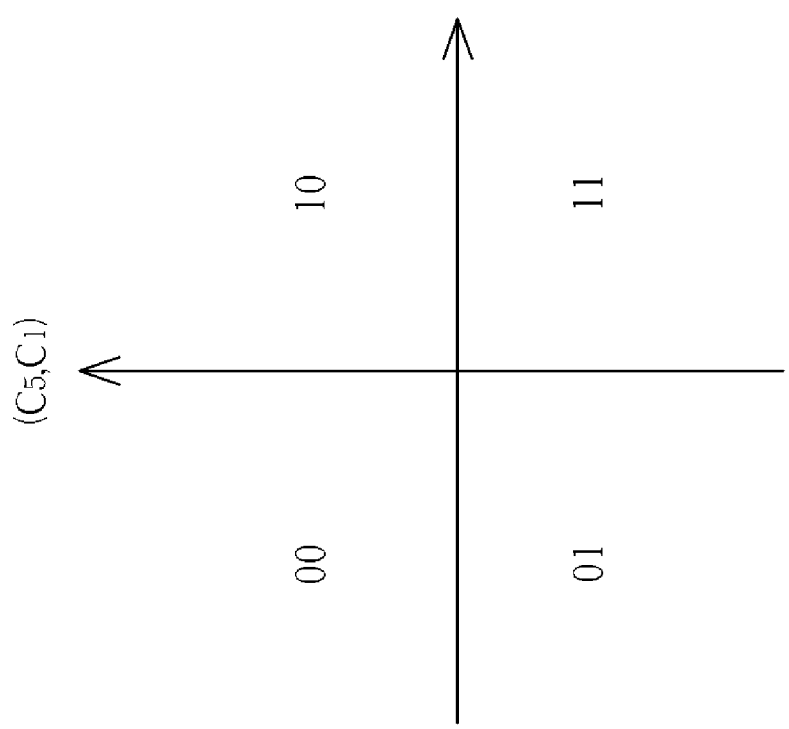
FIG. 18 is a diagram illustrating values of $c_5$ and $c_1$ corresponding to different quadrants when $(c_4, c_0)=(1, 0)$.
Figure 19:
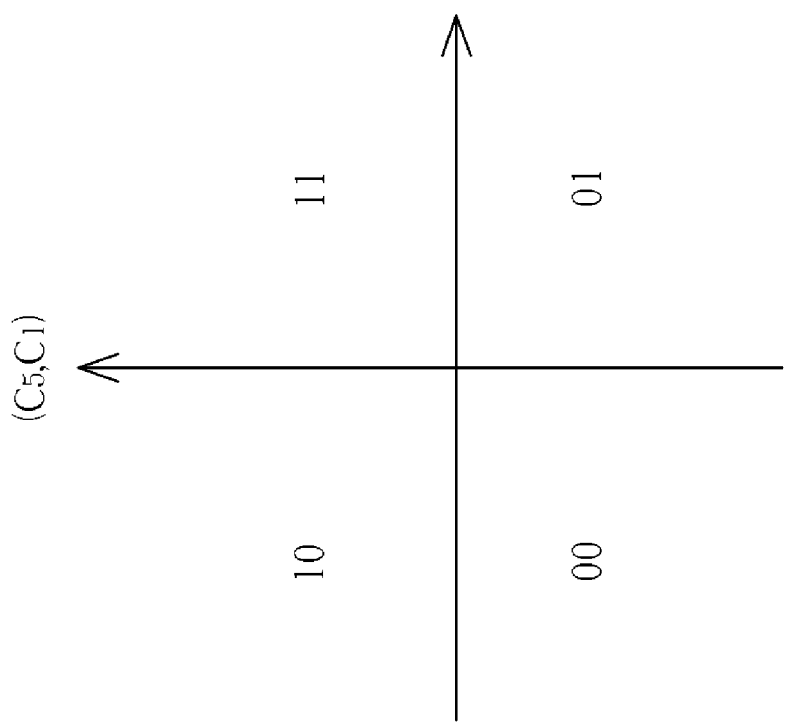
FIG. 19 is a diagram illustrating values of $c_5$ and $c_1$ corresponding to different quadrants when codeword $(c_4, c_0)=(1, 1)$.

The description below illustrates the operation of the operating unit 460. The operating unit 460 receives the in-phase LSB $c_4$, the quadrature-phase LSB $c_0$, the in-phase sign $S_I$ and the quadrature-phase sign $S_Q$ to determine values of $c_5$ and $c_1$. Please refer to FIG. 16. FIG. 16 is a diagram illustrating the values of $c_5$ and $c_1$ corresponding to different quadrants when $(c_4, c_0)=(0, 0)$. The corresponding quadrant of $c_5$, $c_1$ is determined by the in-phase sign $S_I$ and the quadrature-phase sign $S_Q$, in other words, when $(S_I, S_Q)=(1, 1)$, codeword $(c_5, c_1)$ corresponds to 00 in the first quadrant; when $(S_I, S_Q)=(0, 1)$, codeword $(c_5, c_1)$ corresponds to 01 in the second quadrant; when $(S_I, S_Q)=(0, 0)$, codeword $(c_5, c_1)$ corresponds to 11 in the third quadrant; and when $(S_I, S_Q)=(1, 0)$, codeword $(c_5, c_1)$ corresponds to 10 in the fourth quadrant. Similarly, when $(c_4, c_0)=(0, 1)$, the values of $c_5$ and $c_1$ corresponding to different quadrants are illustrated in FIG. 17; when $(c_4, c_0)=(1, 0)$, the values of codeword $c_5$ and $c_1$ corresponding to different quadrants are illustrated in FIG. 18; when $(c_4, c_0)=(1, 1)$, the values of codeword $c_5$ and $c_1$ corresponding to different quadrants are illustrated in FIG. 19. The relations shown of FIGS. 16 through 19 can be represented by equations as shown below:

$$c_5=\overline{(c_0 \oplus c_4)} \cdot (c_4 \oplus S_Q)+(c_0 \oplus c_4) \cdot (c_4 \oplus S_I) \qquad (3)$$

$$c_1=\overline{(c_0 \oplus c_4)} \cdot (c_0 \oplus S_I)+(c_0 \oplus c_4) \cdot (c_0 \oplus S_Q) \qquad (4)$$

IN equations (3) and (4) the following notation is utilized: "¯" indicates a NOT operator, $\oplus$ indicates an exclusive OR (XOR) operator, · indicates an AND operator, and + indicates an OR operator. Please note that, the results in FIGS. 15 through 18 can be obtained by rotating the coordinate; for the example, the result of FIG. 17 can be obtained from FIG. 16 by rotating the coordinate 90° counter-clockwise, and the result of FIG. 19 can be obtained from FIG. 18 by rotating the coordinate 90° counter-clockwise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A demapper, applied to a quadrature amplitude modulation trellis coded modulation (QAM-TCM) decoder, for generating in-phase more significant bits and quadrature-phase more significant bits of a QAM signal according to the QAM signal, at least an in-phase less significant bit of the QAM signal, and at least a quadrature-phase less significant bit of the QAM signal, the demapper comprising:
   an in-phase threshold value comparing and mapping unit, for generating at least an in-phase more-significant-bit buffered value according to a comparing result of a value of an in-phase component of the QAM signal and at least an in-phase threshold value of the QAM signal;
   a quadrature-phase threshold value comparing and mapping unit, for generating at least a quadrature-phase more-significant-bit buffered value according to a comparing result of a value of a quadrature-phase component of the QAM signal and at least a quadrature-phase threshold value of the QAM signal;
   a sign bit decider, for determining an in-phase sign and a quadrature-phase sign according to signs of the in-phase component and the quadrature-phase component;
   a multiplexer, coupled to the sign bit decider, the in-phase threshold value comparing and mapping unit and the quadrature-phase threshold value comparing and mapping unit, for generating a first more-significant-bit estimated value and a second more-significant-bit estimated value according to the in-phase sign, the quadrature-phase sign, the in-phase more-significant-bit buffered value and the quadrature-phase more-significant-bit buffered value; and
   an operating unit, coupled to the sign bit decider, for determining a third more-significant-bit estimated value and a fourth more-significant-bit estimated value according to the in-phase less significant bits, the quadrature-phase less significant bits, the in-phase sign and the quadrature-phase sign;
   wherein the first more-significant-bit estimated value, the second more-significant-bit estimated value, the third more-significant-bit estimated value, and the fourth more-significant-bit estimated value correspond to different bits of the in-phase more significant bits or the quadrature-phase more significant bits; when the in-phase sign equals the quadrature-phase sign, the multiplexer makes the first more-significant-bit estimated value equal to the in-phase more-significant-bit buffered value and makes the second more-significant-bit estimated value equal to the quadrature-phase more-significant-bit buffered value; and when the in-phase sign does not equal the quadrature-phase sign, the multiplexer makes the first more-significant-bit estimated value equal to the quadrature-phase more-significant-bit buffered value and makes the second more-significant-bit estimated value equal to the in-phase more-significant-bit buffered value.

2. The demapper of claim 1, further comprising:
   a shifter, for performing a coordinate shifting to the in-phase component and the quadrature-phase component of the QAM signal and then generating a shifted in-phase component and a shifted quadrature-phase component corresponding to the QAM signal according to the in-phase less significant bits and the quadrature-phase less significant bits;
   wherein the in-phase threshold value comparing and mapping unit is coupled to the shifter, and outputs the in-phase more-significant-bit buffered value according to a comparing result of a value of the shifted in-phase component and the in-phase threshold value; and the quadrature-phase threshold value comparing and mapping unit is coupled to the shifter, and outputs the quadrature-phase more-significant-bit buffered value according to a comparing result of a value of the shifted quadrature-phase component and the quadrature-phase threshold value.

3. The demapper of claim 2, wherein the shifter comprises:
   a less-significant-bit mapping unit, for determining an in-phase shifting value and a quadrature-phase shifting value according to the in-phase less significant bits and the quadrature-phase less significant bits;
   an in-phase adder, coupled to the in-phase shifting value, for shifting the in-phase component according to the in-phase shifting value to generate the shifted in-phase component; and
   a quadrature-phase adder, coupled to the quadrature-phase shifting value, for shifting the quadrature-phase component according to the quadrature-phase shifting value to generate the shifted quadrature-phase component.

4. The demapper of claim 2, wherein the in-phase threshold value comparing and mapping unit and the quadrature-phase threshold value comparing and mapping unit generate a normalized in-phase component and a normalized quadrature-phase component by obtaining absolute values of the shifted in-phase component and the shifted quadrature-phase component, and then proceed to comparing operation upon the normalized in-phase component and the normalized quadrature-phase component.

5. The demapper of claim 4, wherein the in-phase threshold value comparing and mapping unit is a bit selector, for selecting at least one bit of the normalized in-phase component to generate the in-phase more-significant-bit buffered value, and the quadrature-phase threshold value comparing and mapping unit is a bit selector, for selecting at least one bit of the normalized quadrature-phase component to generate the quadrature-phase more-significant-bit buffered value.

6. The demapper of claim 5, wherein the QAM-TCM decoder is a 64 QAM-TCM decoder, the in-phase threshold value comparing and mapping unit selects a third bit counting from a least significant bit of an integer part of the normalized in-phase component to be the in-phase more-significant-bit buffered value, and the quadrature-phase threshold value comparing and mapping unit selects a third bit counting from a least significant bit of an integer part of the normalized quadrature-phase component to be the quadrature-phase more-significant-bit buffered value.

7. The demapper of claim 5, wherein the QAM-TCM decoder is a 256 QAM-TCM decoder, the in-phase threshold value comparing and mapping unit selects a third and a fourth bits counting from a least significant bits of an integer part of the normalized in-phase component be the in-phase more-significant-bit buffered value, and the quadrature-phase threshold value comparing and mapping unit selects a third and a fourth bits counting from a least significant bit of an integer part of the normalized quadrature-phase component to be the quadrature-phase more-significant-bit buffered value.

8. The demapper of claim 1, wherein the in-phase sign and the quadrature-phase sign divides a two-dimension plane into four quadrants, and each quadrant corresponds to a combination of the third more-significant-bit estimated value and the fourth more-significant-bit estimated value, and four combinations of the third more-significant-bit estimated value and the fourth more-significant-bit estimated value for different combinations of the in-phase less significant bit and the quadrature-phase less significant bit can be obtained through coordinate rotation, respectively.

9. A demapping method, applied to a quadrature amplitude modulation trellis coded modulation (QAM-TCM) decoder, for generating in-phase more significant bits and quadrature-phase more significant bits of a QAM signal according to the QAM signal, at least an in-phase less significant bits of the QAM signal, and at least a quadrature-phase less significant bit of the QAM signal, the demapping method comprising:

generating at least an in-phase more-significant-bit buffered value according to a comparing result of a value of an in-phase component of the QAM signal and at least an in-phase threshold value of the QAM signal;

generating at least a quadrature-phase more-significant-bit buffered value according to a comparing result of a value of a quadrature-phase component of the QAM signal and at least a quadrature-phase threshold value of the QAM signal;

determining an in-phase sign and a quadrature-phase sign according to signs of the in-phase component and the quadrature-phase component;

generating a first more-significant-bit estimated value and a second more-significant-bit estimated value according to the in-phase sign, the quadrature-phase sign, the in-phase more-significant-bit buffered value and the quadrature-phase more-significant-bit buffered value;

determining a third more-significant-bit estimated value and a fourth more-significant-bit estimated value according to the in-phase less significant bits, the quadrature-phase less significant bits, the in-phase sign and the quadrature-phase sign; and performing a coordinate shifting to the in-phase component and the quadrature-phase component of the QAM signal and then generating a shifted in-phase component and a shifted quadrature-phase component corresponding to the QAM signal according to the in-phase less significant bits and the quadrature-phase less significant bits;

wherein the first more-significant-bit estimated value, the second more-significant-bit estimated value, the third more-significant-bit estimated value and the fourth more-significant-bit estimated value correspond to different bits of the in-phase more significant bits or the quadrature-phase more significant bits; the steps of outputting the in-phase more-significant-bit buffered value is according to a comparing result of a value of the shifted in-phase component and the in-phase threshold value; the steps of outputting the quadrature-phase more-significant-bit buffered value is according to a comparing result of a value of the shifted quadrature-phase component and the quadrature-phase threshold value; and the steps of generating the in-phase more-significant-bit buffered value and the quadrature-phase more-significant-bit buffered value by obtaining absolute values of the shifted in-phase component and the shifted quadrature-phase component to generate a normalized in-phase component and a normalized quadrature-phase component, and then proceed to comparing operation upon the normalized in-phase component and the normalized quadrature-phase component.

10. The demapping method of claim 9, wherein the steps of generating the shifted in-phase component and the shifted quadrature-phase component comprises:

determining an in-phase shifting value and a quadrature-phase shifting value according to the in-phase less significant bits and the quadrature-phase less significant bits;

shifting the in-phase component according to the in-phase shifting value to generate the shifted in-phase component; and shifting the quadrature-phase component according to the quadrature-phase shifting value to generate the shifted quadrature-phase component.

11. The demapping method of claim 9, wherein the in-phase threshold value comparing and mapping unit is a bit selector, for selecting at least one bit of the normalized in-phase component to generate the in-phase more-significant-bit buffered value, and the quadrature-phase threshold value comparing and mapping unit is a bit selector, for selecting at least one bit of the normalized quadrature-phase component to generate the quadrature-phase more-significant-bit buffered value.

12. The demapping method of claim 11, wherein the QAM-TCM decoder is a 64 QAM-TCM decoder, the in-phase more-significant-bit buffered value is a third bit counting from a least significant bit of an integer part of the normalized in-phase component, and the quadrature-phase more-significant-bit buffered value is a third bit counting from a least significant bit of an integer part of the normalized quadrature-phase component.

13. The demapping method of claim 11, wherein the QAM-TCM decoder is a 256 QAM-TCM decoder, the in-phase more-significant-bit buffered value comprises a third and the fourth bits counting from a least significant bits of an integer part of the normalized in-phase component, and the quadrature-phase more-significant-bit buffered value comprises a third and the fourth bits counting from a least significant bit of an integer part of the normalized quadrature-phase component.

14. The demapping method of claim 9, wherein the in-phase sign and the quadrature-phase sign divides a two-dimension plane into four quadrants, and each quadrant corresponds to a combination of the third more-significant-bit estimated value and the fourth more-significant bit estimated value, and four combinations of the third more-significant-bit estimated value and the fourth more-significant-bit estimated value for different combinations of the in-phase less significant bit and the quadrature-phase less significant bit can be obtained through coordinate rotation, respectively.

15. The demapping method of claim 9, wherein when the in-phase sign equals the quadrature-phase sign, the first more-significant-bit estimated value is equal to the in-phase more-significant-bit buffered value and the second more-significant-bit estimated value is equal to the quadrature-phase more-significant-bit buffered value; when the in-phase sign does not equal the quadrature-phase sign, the first more bits estimated value is equal to the quadrature-phase more-significant-bits buffered value and the second more-significant-bit estimated value is equal to the in-phase more-significant-bit buffered value.

* * * * *